United States Patent
Leinwander

(10) Patent No.: US 10,388,330 B1
(45) Date of Patent: *Aug. 20, 2019

(54) USING OUT-OF-BAND SIGNALING TO COMMUNICATE WITH DAISY CHAINED NONVOLATILE MEMORIES

(71) Applicant: Micron Technology, Inc., Boise, ID (US)

(72) Inventor: Mark Leinwander, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/682,221

(22) Filed: Aug. 21, 2017

Related U.S. Application Data

(63) Continuation of application No. 14/160,347, filed on Jan. 21, 2014, now Pat. No. 9,741,398, which is a continuation of application No. 12/463,337, filed on May 8, 2009, now abandoned.

(51) Int. Cl.
*G06F 13/42* (2006.01)
*G11C 5/06* (2006.01)

(52) U.S. Cl.
CPC ............ *G11C 5/06* (2013.01); *G06F 13/4247* (2013.01); *G06F 13/4282* (2013.01); *G09G 2370/14* (2013.01)

(58) Field of Classification Search
CPC .................. G06F 13/1684; G06F 13/4247
See application file for complete search history.

(56) References Cited

U.S. PATENT DOCUMENTS

| | | | |
|---|---|---|---|
| 3,691,538 A | 9/1972 | Haney et al. | |
| 7,062,594 B1 | 6/2006 | Sardella et al. | |
| 7,130,958 B2 | 10/2006 | Chou et al. | |
| 7,221,613 B2 | 5/2007 | Pelley et al. | |
| 7,307,269 B2 | 12/2007 | Kim et al. | |
| 7,342,816 B2 * | 3/2008 | Bartley | G11C 29/26 365/230.05 |
| 7,475,174 B2 | 1/2009 | Chow et al. | |
| 7,504,863 B2 | 3/2009 | Kim | |
| 7,590,020 B2 | 9/2009 | Lee | |
| 7,721,130 B2 | 5/2010 | Prete et al. | |
| 7,889,578 B2 | 2/2011 | Schuetz et al. | |
| 8,060,799 B2 | 11/2011 | Lee | |
| 8,990,464 B2 | 3/2015 | Kessler | |
| 9,123,409 B2 | 9/2015 | Eilert et al. | |
| 9,741,398 B1 | 8/2017 | Leinwander | |
| 9,946,679 B2 * | 4/2018 | Chavez | G06F 1/26 |
| 2008/0031077 A1 | 2/2008 | Bartley et al. | |
| 2014/0025999 A1 * | 1/2014 | Kessler | G06F 13/4295 714/43 |
| 2015/0236844 A1 * | 8/2015 | Pan | H04L 7/0008 370/503 |

* cited by examiner

*Primary Examiner* — Brian T Misiura
(74) *Attorney, Agent, or Firm* — Schwegman Lundberg & Woessner, P.A.

(57) ABSTRACT

Memory devices connected in a chain topology to a host controller that communicate using Low Voltage Differential Signaling (LVDS) and out-of-band signaling.

20 Claims, 3 Drawing Sheets

USING OUT-OF-BAND SIGNALING TO COMMUNICATE WITH DAISY CHAINED NONVOLATILE MEMORIES

PRIORITY APPLICATIONS

This application is continuation of U.S. application Ser. No. 14/160,347, filed Jan. 21, 2014, now issued as U.S. Pat. No. 9,741,398, which is a continuation of U.S. application Ser. No. 12/463,337, filed May 8, 2009, each of which is incorporated herein by reference in its entirety.

BACKGROUND OF THE INVENTION

Memory is found in most digital machines whether it be switches, routers, appliances, or servers. The machines contain physical memory alongside the logic, and when performance gains are needed the solution has typically involved adding more memory. However, a new cloud computing infrastructure concept consists of providing reliable services that are delivered through data centers where computing power is shared. By decoupling the physical resources and distributing them across a network, services can be provisioned on-demand and the memory is distributed and shared as an available network resource to any application. Additional improvements are needed to improve response times from data storage infrastructures.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
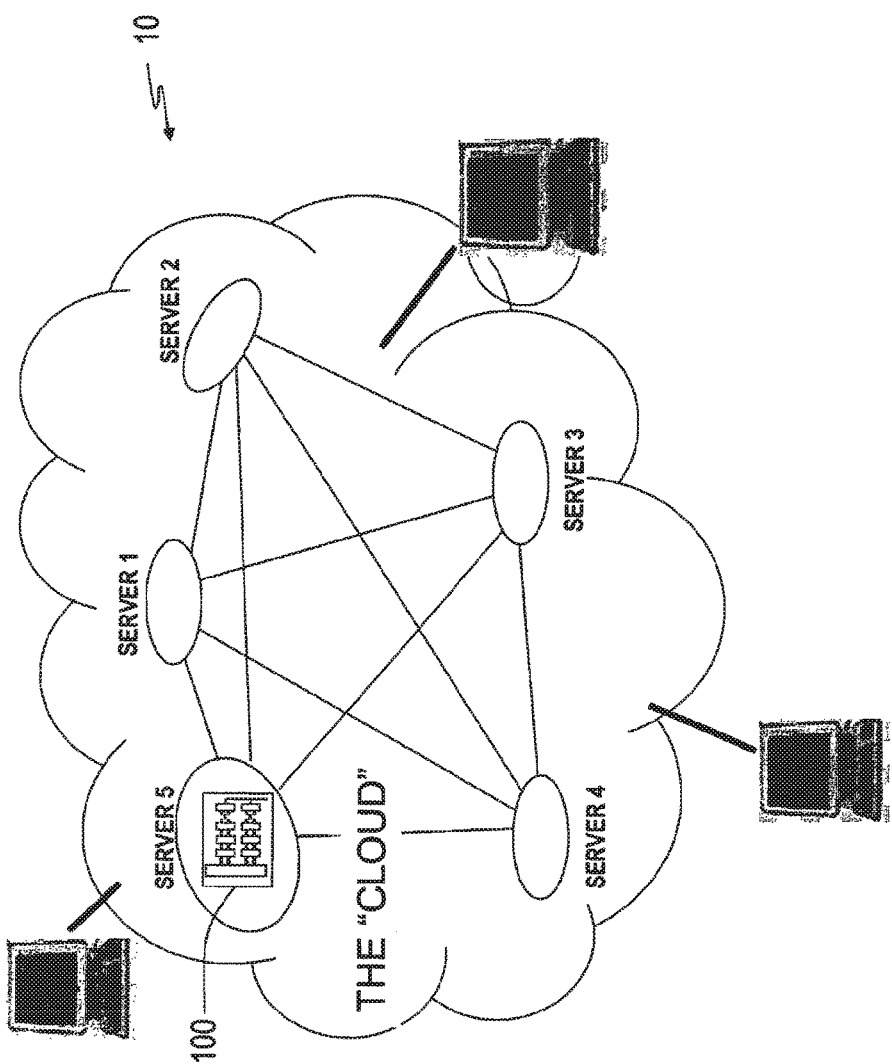
FIG. 1 illustrates a server having a host controller and memory devices connected in a chain topology in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Use of the terms "coupled" and "connected", along with their derivatives, may be used. It should be understood that these terms are not intended as synonyms for each other. Rather, in particular embodiments, "connected" may be used to indicate that two or more elements are in direct physical or electrical contact with each other. "Coupled" may be used to indicated that two or more elements are in either direct or indirect (with other intervening elements between them) physical or electrical contact with each other, and/or that the two or more elements co-operate or interact with each other (e.g. as in a cause and effect relationship).

Cloud computing incorporates the fundamental building blocks used in computing and refers to both the applications delivered as services over the Internet and the hardware and systems software in the data centers that provide those services. It is no longer necessary for the processing device to have the power or the hard disk space demanded by the traditional desktop PC when running web-based applications in the cloud environment.

Cloud computing offers collaboration and document sharing through computer connections to the Internet. With web-based applications, documents are available with the virtually limitless storage in the cloud. FIG. 1 illustrates memory devices 100 that may be used in these high-density memory systems 10, where an address/command path and data path in the memory devices are connected in accordance with features of the present invention to reduce system cost and complexity.

Various memory interfaces allow low pin-count packages which occupy less board space and lower total system costs. One such interface is a four-wire Serial Peripheral Interface (SPI) that allows application-specific controllers to execute code directly from serial memory. Another interface, the I2C bus transmits data and clock with Serial Data (SDA) and Serial Clock (SCL) from an I2C master to slave devices. A Joint Test Action Group (JTAG) interface allows communication to an external device for programming of memory. These memory interfaces are provided as examples and the present invention is not limited to a specific interface.

In various embodiments, the memory devices in FIG. 1 may use different process technologies and metallurgical combinations to implement nonvolatile characteristics and provide long lifetimes, low power, and high memory density. In one embodiment, the nonvolatile memory may use Phase-Change Memory (PCM) arrays having alloys of elements such as Te or Se that are referred to as chalcogenides or chalcogenic materials. The PCM arrays may also be referred to as Phase-Change Random Access Memory (PRAM or PCRAM), Ovonic Unified Memory (OUM) or Chalcogenide Random Access Memory (C-RAM).

In another embodiment the memory arrays may be Magnetic Random Access Memory (MRAM) cells where magnetic storage elements are formed from two ferromagnetic plates located at an Intersection of a row and column line and selected by a Magnetic Tunnel Junction (MTJ) device. In yet another embodiment, the memory arrays may be Ferroelectric Random Access Memory (FRAM) cells that include ferroelectric material. Alternatively, the nonvolatile memory may include Programmable Metallization Cells (PMC) that are based on two solid metal electrodes and a thin film of electrolyte between them, alternatively referred to as Conductive-Bridging RAM, or CBRAM.

Figure 2:
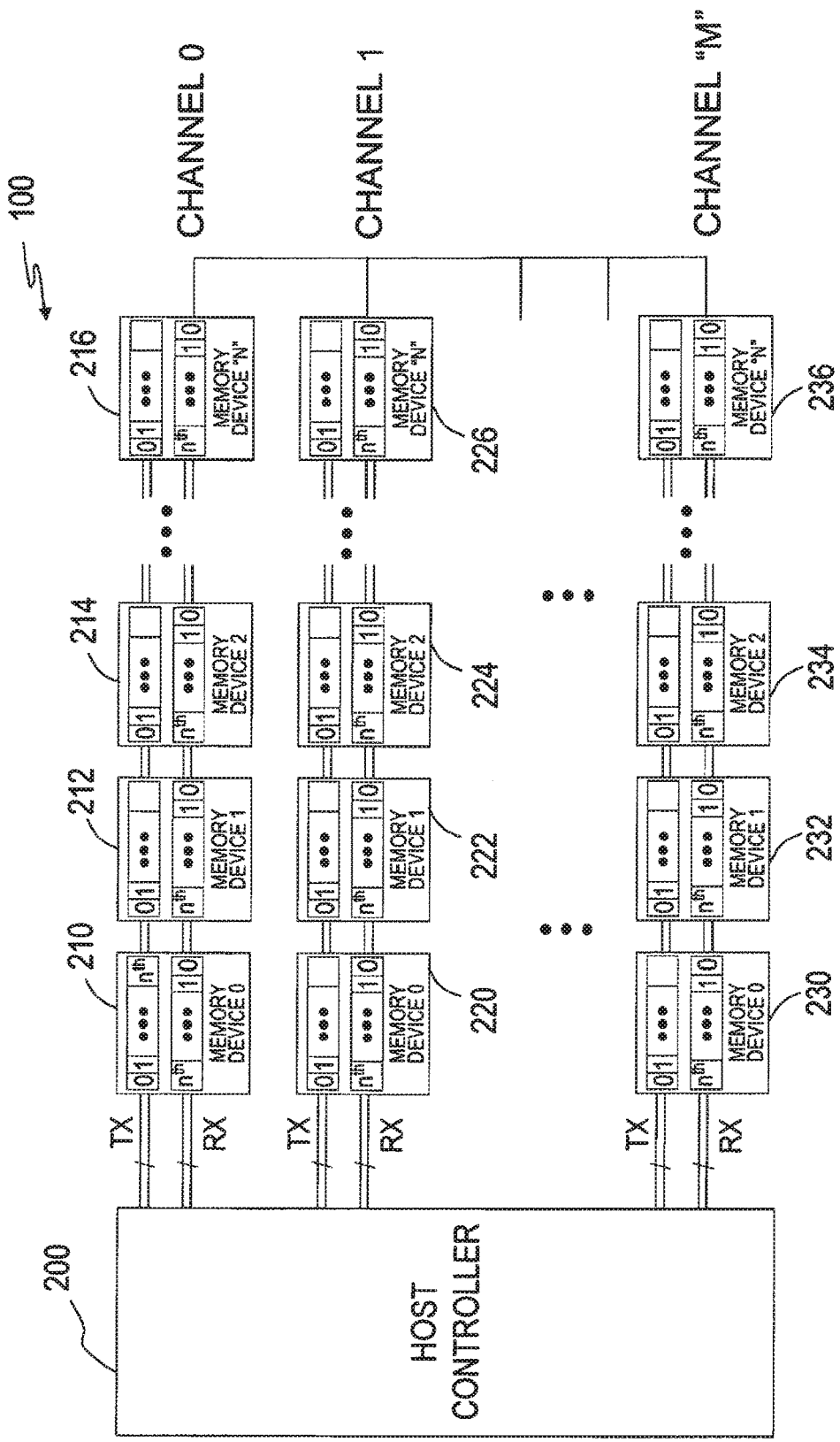
FIG. 2 shows the memory devices connected in a chain topology to the host controller and communicating using Low Voltage Differential Signaling (LVDS) and out-of-band, full-duplex signaling.

FIG. 2 illustrates a host controller 200 that uses a high-speed, Low Voltage Differential Signaling (LVDS) protocol to communicate with chains of memory devices connected to communication channels. The differential signaling will reduce power consumption, increase the bandwidth per pin capacity, and reduce EMI. As shown, this architecture utilizes point-to-point physical connections to reduce the signal count by utilizing a host controller 200 with a channel "0" to communicate with a first chain of "N" memory devices 210, 212, 214, . . . , 216; a channel "1" to communicate with additional memory devices 220, 222, 224, . . . , 226 connected in a second chain; and a channel "M" to communicate with chained memory devices 230, 232, 234, . . . , 236.

For each communication channel, host controller 200 provides separate electrical paths to the serially-connected, chained memory devices, where a first electrical path is for transmitting (TX) addresses, commands, and data; and a second electrical path is for receiving (RX) information stored by the chain of memory devices. Thus, this embodiment allows host controller 200 to transmit packets of information to the memory devices connected along the memory chain.

Figure 3:
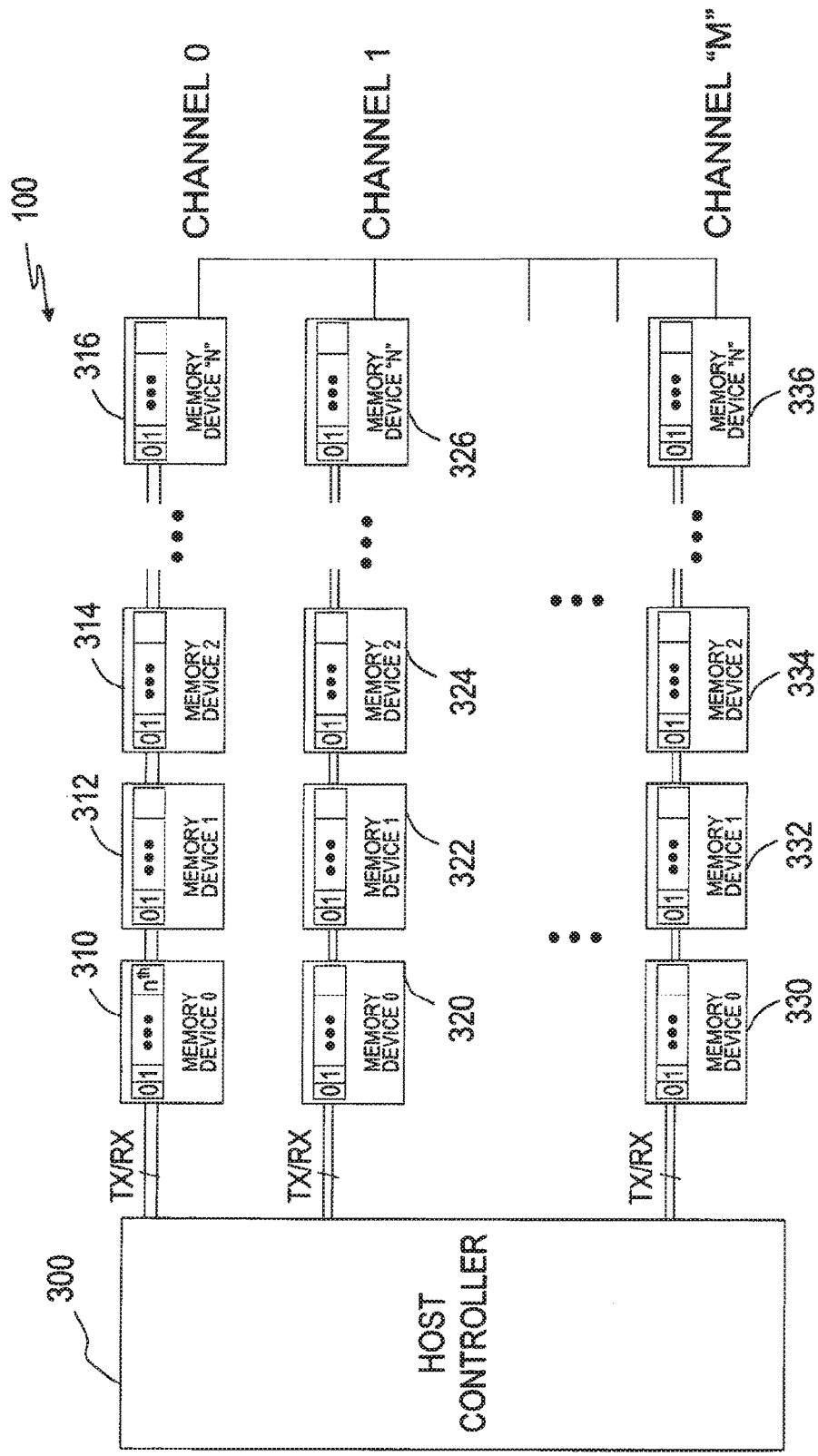
FIG. 3 shows the memory devices connected in a chain topology to the host controller and communicating using Low Voltage Differential Signaling (LVDS) and out-of-band signaling for a USB case that is not full-duplex.

FIG. 3 illustrates a host controller 300 that uses a high-speed, Low Voltage Differential Signaling (LVDS) protocol to communicate with chains of memory devices also connected to communication channels. However, in this embodiment the transmit and receive paths share the same electrical signals, i.e., a common channel denoted in the figure as TX/RX. Host controller 300 communicates with a first chain of "N" memory devices 310, 312, 314, . . . , 316 via channel "0"; the chain of memory devices 320, 322, 324, . . . , 326 via channel "1"; and the chained memory devices 330, 332, 334, . . . , 336 utilizing channel "M". Thus, for the USB case that is not full-duplex, the host controller still communicates with chains of memory devices using LVDS and out-of-band signaling to reduce bandwidth and signal count. Clock recovery data and ECC data may be transmitted.

The chained memory devices are packet-protocol memory devices. Based on the packet format, included information may provide device identification (device ID), commands, row addresses, column addresses, and data. Packets contain the correct bit information in the correct packet locations and are shifted into the memory devices. The memory device having the device ID corresponding to the device ID contained in the transmitted packet is selected to receive additional packet information. The selected device may then move into a proper power state to receive additional packets having addresses that specify write and read operations. Note that the packets are sent to the chained memory devices over the TX lines, while the RX lines are used by the identified memory devices to return data to the host controller 200. Thus, memory devices are chained along a channel in point-to-point full-duplex connections.

By now it should be apparent that embodiments of the present invention chain together one to "N" memory devices to reduce system costs, yet allow high speed data transfers in a high-density memory system. The controller in this system uses low voltage differential signaling and provides out-of-band communications that allow host independent operations. The host controller coordinates reading and writing to memory devices that are chained to each other, where the length of the chain depends on the initial latency that the system requires. Due to the reduced pin count, multiple channels may be connected to the host controller.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A memory system comprising:
multiple chains of memory devices each coupled to a separate packet-based communication channel, the separate packet-based communication channel for each of the chains of memory comprising a single Low Voltage Differential Signaling (LVDS) path as both transmit and receive paths, each of the multiple chains of memory devices having:
multiple non-volatile memory devices each coupled to a host controller through respective ones of the packet-based communication chains, each of the multiple non-volatile memory devices being configured to receive packets from the host controller using LVDS on a respective one of the separate packet-based communication channels comprising the single LVDS path and to transmit stored information to the host controller on the respective one of the separate packet-based communication channels comprising the single LVDS path.

2. The memory system of claim 1, wherein the multiple non-volatile memory devices are chained along the separate packet based communication channel of each chain in point-to-point connections.

3. The memory system of claim 1, wherein one or more of the multiple non-volatile memory devices include a transmit shift register to transfer packets from the host controller through the separate packet-based communication channel.

4. The memory system of claim 1, wherein one or more of the multiple non-volatile memory devices include a receive shift register to transfer packets to the host controller through the separate packet-based communication channel.

5. The memory system of claim 1, further comprising the host controller, wherein the host controller includes multiple channels with each channel being configured to communicate separately with a separate packet-based communication chain.

6. The memory system of claim 5, wherein the host controller is configured to coordinate reading and writing to selected ones of the multiple non-volatile memory devices.

7. The memory system of claim 5, wherein the host controller has multiple channels configured to provide out-of-band signaling.

8. The memory system of claim 7, wherein the out-of-band signaling is to allow allows host-independent operations of the multiple non-volatile memory devices.

9. The memory system of claim 1, wherein the separate packet-based communication channel is configured to not use full-duplex signals.

10. The memory system of claim 1, wherein a length of the separate packet-based communication channel for each of the chains of memory is determined based on a system latency.

11. A system, comprising:
a first group of multiple memory devices in a first serially-connected chain and a second group of multiple memory devices in a second serially-connected chain, the first serially-connected chain and the second serially-connected chain being coupled to a first common channel and a second common channel, respectively; and
a host controller configured to communicate bi-directionally on the first common channel with the first group of multiple memory devices using a first single Low Voltage Differential Signaling (LVDS) path and bi-directionally on the second common channel with the second group of multiple memory devices using a second single Low Voltage Differential Signaling (LVDS) path.

12. The system of claim 11, wherein the first common channel and the second common channel are each shared transmit/receive (TX/RX) channels.

13. The system of claim 11, wherein communications over the first common channel and the second common channel are packet-based.

14. The system of claim 11, wherein the multiple memory devices are configured to use out-of-band signaling over the respective common channel.

15. The system of claim 14, wherein the out-of-band signaling allows the multiple memory devices to perform host-independent operations.

16. A method, comprising:
transmitting, from a host controller, addresses, commands, and data along a first communication channel comprising a single path using Low Voltage Differential Signaling (LVDS);
receiving packets at a non-volatile memory device from the host controller in a packet-based communication chain, non-volatile memory device receiving packets from the host controller only on the first communication channel via the single path using LVDS; and
sending stored information, responsive to the commands, from the non-volatile memory device to the host controller only on the first communication channel via the single path using LVDS, the first communication channel being a shared transmit/receive (TX/RX) channel.

17. The method of claim 16, further comprising using out-of-band signaling to allow the multiple memory devices to perform host-independent operations.

18. The method of claim 16, further comprising:
transferring packets from the host controller through a transmit shift register in the non-volatile memory device in the packet-based communication chain; and
transferring packets to the host controller through a receive shift register in the non-volatile memory device in the packet-based communication chain.

19. The method of claim 16 further comprising:
transmitting, from the host controller, addresses, commands, and data to multiple non-volatile memory devices along a plurality of communication channels each comprising a corresponding single path using LVDS;
receiving packets at the multiple non-volatile memory devices from the host controller in a packet-based communication chain for each of the plurality of communication channels using the corresponding single path, each of the multiple non-volatile memory devices receiving packets from the host controller only on the corresponding single path for a corresponding communication channel of the plurality of communication channels; and
sending stored information, responsive to the commands, from each of the multiple non-volatile memory devices to the host controller only on the corresponding single path for a corresponding communication channel of the plurality of communication channels, each of the plurality of communication channels being a shared transmit/receive (TX/RX) channel.

20. The method of claim 17, wherein the out-of-band signaling allows the multiple memory devices to perform host-independent operations.

* * * * *